United States Patent
Mutoh

(10) Patent No.: US 6,548,228 B2
(45) Date of Patent: Apr. 15, 2003

(54) METHOD OF AND APPARATUS FOR DEVELOPING EXPOSED PHOTORESIST TO PREVENT IMPURITY FROM BEING ATTACHED TO WAFER SURFACE

(75) Inventor: Akira Mutoh, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/772,291

(22) Filed: Jan. 29, 2001

(65) Prior Publication Data

US 2001/0018167 A1 Aug. 30, 2001

(30) Foreign Application Priority Data

Feb. 3, 2000 (JP) .......................................... 2000-026206

(51) Int. Cl.[7] .............................. G03F 7/30; G03F 7/38
(52) U.S. Cl. ......................... 430/325; 430/311; 430/328
(58) Field of Search ................................. 430/325, 328, 430/311

(56) References Cited

U.S. PATENT DOCUMENTS 4,422,904 A    12/1983   Wilkinson
5,885,755 A     3/1999   Nakagawa et al. .......... 430/325
6,159,662 A    12/2000   Chen et al. ................... 430/313

FOREIGN PATENT DOCUMENTS

| JP | 60-124821 | 7/1985 |
| JP | 7-142344 | 6/1995 |
| JP | 9-297403 | 11/1997 |
| JP | 10-50606 | 2/1998 |
| JP | 11-054427 | 2/1999 |

*Primary Examiner*—Richard L. Schilling
(74) *Attorney, Agent, or Firm*—Choate, Hall & Stewart

(57) ABSTRACT

After a silicon wafer is held horizontally such that a surface thereof coated with a photoresist faces upwardly, the surface of the silicon wafer is supplied with a cleaning liquid to form a puddle thereof before a developing liquid is supplied. After the puddle of the cleaning liquid is formed, the silicon wafer starts to be rotated and the developing liquid starts to be supplied to the surface of the silicon wafer. The developing liquid is supplied to the surface of the silicon wafer with the puddle of the cleaning liquid being formed thereon. Alternatively, developing liquid is supplied to the surface of the silicon wafer which is being supplied with cleaning liquid while the silicon wafer is being rotated.

12 Claims, 15 Drawing Sheets

METHOD OF AND APPARATUS FOR DEVELOPING EXPOSED PHOTORESIST TO PREVENT IMPURITY FROM BEING ATTACHED TO WAFER SURFACE

BACKGROUND OF THE INVENTION

1. Field of the Invention

The present invention relates to a method of and an apparatus for developing an exposed photoresist coated on the surface of a silicon wafer, with a developing liquid, a development control apparatus for controlling various components of a developing apparatus, and an information storage medium which stores, as software, a program for enabling a computer to perform various processing operations.

2. Description of the Related Art

At present, fine interconnection patterns of semiconductor circuit devices are formed by photolithography. According to the photolithographic process, it is necessary to develop an exposed photoresist coated on the surface of a silicon wafer with a developing liquid by a developing apparatus.

One conventional developing apparatus will be described below with reference to FIGS. 1a, 1b through 5 of the accompanying drawings. The conventional developing apparatus, denoted by 100, processes silicon wafer 101 with a photoresist coated on its surface. As shown in FIG. 4a, developing apparatus 100 has wafer chuck mechanism 102 as a wafer holding means. Wafer chuck mechanism 102 is mounted on the upper end of rotatable shaft 103 which extends vertically. Silicon wafer 101 is detachably held by wafer chuck mechanism 102 such that the surface coated with the photoresist lies horizontally and faces upwardly.

Rotatable shaft 103 with wafer chuck mechanism 102 mounted on its upper end is rotatably supported by wafer rotating mechanism 104 (see FIG. 3) as a wafer rotating means which comprises a drive motor or the like. Wafer rotating mechanism 104 rotates silicon wafer 101 supported by wafer chuck mechanism 102 in a horizontal plane.

As shown in FIG. 3, developing apparatus 100 also has developing liquid supply mechanism 105 as a developing liquid supply means which comprises a tank and a pump, and cleaning liquid supply mechanism 106 as a cleaning liquid supply means which comprises a tank and a pump. Developing liquid supply mechanism 105 supplies developing liquid 107 comprising an aqueous alkaline liquid to the surface of silicon wafer 101 held by wafer chuck mechanism 102. Cleaning liquid supply mechanism 106 supplies pure water 108 as a cleaning liquid. Developing liquid supply mechanism 105 has developing nozzle 109, and cleaning liquid supply mechanism 106 has cleaning nozzle 110. Developing nozzle 109 and cleaning nozzle 110 are movably supported by nozzle moving mechanism 111. As shown in FIGS. 1a through 2b, nozzle moving mechanism 111 moves developing nozzle 109 and cleaning nozzle 110 between a position which faces the surface of silicon wafer 101 held by wafer chuck mechanism 102 and a position retracted away from the surface of silicon wafer 101.

Developing nozzle 109 has a slit structure capable of supplying a screen of developing liquid 107 diametrically across silicon wafer 101, which is of a disk shape, at the center of silicon wafer 101. Cleaning nozzle 110 comprises a slender pipe capable of supplying pure water 108 to a central position on silicon wafer 101.

As shown in FIG. 3, wafer rotating mechanism 104, developing liquid supply mechanism 105, cleaning liquid supply mechanism 106, and nozzle moving mechanism 111 are connected to operation control apparatus 112 comprising a computer as a development control apparatus. A control program for controlling a developing process is installed in operation control apparatus 112. Based on the installed control program, operation control apparatus 112 controls operation of the above mechanisms 104, 105, 106, 111 to perform the developing process.

Developing apparatus 100 can develop an exposed photoresist coated on the surface of the silicon wafer 101 with developing liquid 107 supplied thereto. Supplied developing liquid can be washed away from the surface of the silicon wafer 101 by pure water 108.

More specifically, as shown in FIG. 4a, silicon wafer 101 whose surface is coated with a photoresist is horizontally held by wafer chuck mechanism 102. Then, as shown in FIG. 5, silicon wafer 101 held by wafer chuck mechanism 102 is rotated at a high speed by wafer rotating mechanism 104.

In a period ① shown in FIG. 5, developing nozzle 109 of developing liquid supply mechanism 105 is moved to a position facing the surface of silicon wafer 101 by nozzle moving mechanism 111. Thereafter, as shown in FIG. 4b, in a period ② shown in FIG. 5, developing liquid supply mechanism 105 supplies developing liquid 107 to the surface of silicon wafer 101 which is being rotated at a high speed.

While developing liquid 107 is being supplied to the surface of silicon wafer 101, the rotation of silicon wafer 101 is gradually decelerated to a predetermined speed, after which the supply of developing liquid 107 is stopped. As shown in FIG. 4c, a puddle of developing liquid 107 is now formed on the surface of silicon wafer 101. In a period ③ shown in FIG. 5, the puddle of developing liquid 107 is maintained on the surface of silicon wafer 101 to develop the exposed photoresist.

Developing nozzle 109 is moved to the position away from the surface of silicon wafer 101 by nozzle moving mechanism 111. At the same time, cleaning nozzle 110 of cleaning liquid supply mechanism 106 is moved to the position facing the surface of silicon wafer 101 by nozzle moving mechanism 111.

After a predetermined developing time has elapsed, silicon wafer 101 is rotated at a high speed. As shown in FIG. 4d, in a period ④ shown in FIG. 5, pure water 108 is supplied to the surface of silicon wafer 101 which is being rotated at a high speed. Supplied pure water 108 cleans the surface of silicon wafer 101, removing developing liquid 107 from the surface of silicon wafer 101.

The supply of pure water 108 is stopped after elapse of a certain time. As shown in FIG. 4e, in a period ⑤ shown in FIG. 5, silicon wafer 101 is continuously rotated at a high speed even after the supply of pure water 108 is stopped, drying the surface of silicon wafer 101 with air.

In illustrated conventional developing apparatus 100, developing nozzle 109 and cleaning nozzle 110 are supported by nozzle moving mechanism 111 for movement between the position facing the surface of silicon wafer 101 and the position retracted away from the surface of silicon wafer 101. However, as shown in FIGS. 6a and 6b, another conventional developing apparatus 200 has developing nozzle 109 and cleaning nozzle 110 which are oriented toward the center of silicon wafer 101.

With conventional developing apparatus 200, it is not possible to eject pure water 108 vertically from cleaning nozzle 110 to the surface of silicon wafer 101. However, since it is not necessary to move developing nozzle 109 and cleaning nozzle 110 to the overlapping position, developing nozzle 109 and cleaning nozzle 110 do not need to be replaced with each other.

Therefore, a developing process can quickly be completed as developing nozzle 109 and cleaning nozzle 110 are not required to move in the developing process. However, even in this case, developing nozzle 109 and cleaning nozzle 110 are moved for the replacement of silicon wafer 101.

With conventional developing apparatus 100, 200, the exposed photoresist coated on the surface of silicon wafer 101 can be developed with developing liquid 107, and developing liquid 107 can be washed away from the surface of silicon wafer 101 with pure water 108.

However, actual developing processes performed on silicon wafer 101 by conventional developing apparatus 100, 200 have resulted in many developing defects. Attempts that have been made to find out causes of such developing defects have revealed that when developing liquid 107 is supplied to the surface of silicon wafer 101 that is rotating at a high speed, mist 120 is produced and contaminates developing nozzle 109, as shown in FIG. 4b.

Mist 120 is composed of the developing liquid containing particles of the photoresist. If mist 120 is deposited on developing nozzle 109 and supplied together with developing liquid 107 in the process of developing an exposed photoresist on next silicon wafer 101, then a developing failure tends to occur oh a resist pattern on silicon wafer 101.

In recent years, efforts are being made to increase the diameter of silicon wafer 101 and make resist patterns finer. In view of such efforts, there is a tendency to use a longer developing nozzle 109 to apply developing liquid 107 uniformly to the surface of silicon wafer 101 at a high speed. Therefore, developing nozzle 109 necessarily has an increased area contaminated by mist 120 and hence is liable to cause a greater developing failure on the resist pattern on silicon wafer 101.

SUMMARY OF THE INVENTION

It is therefore an object of the present invention to provide a method of and an apparatus for developing an exposed photoresist coated on the surface of a silicon wafer without causing a developing failure, a development control apparatus for controlling various components of a developing apparatus without causing a developing failure, and an information storage medium which stores, as software, a program for enabling a computer to perform various processing operations without causing a developing failure.

According to an aspect of the present invention, there is provided a method of developing an exposed photoresist coated on a surface of a silicon wafer with a developing liquid. In this method, a cleaning liquid is supplied to the surface of the silicon wafer held by wafer holding means to form a puddle of the cleaning liquid before a developing liquid is supplied to the surface of the silicon wafer. Thereafter, the silicon wafer with the puddle of the cleaning liquid formed thereon is rotated in a horizontal plane, and the developing liquid is supplied to the surface of the silicon wafer.

Therefore, the developing liquid is supplied to the surface of the silicon wafer with the puddle of the cleaning liquid formed thereon. An impurity produced by a mist deposited on a developing nozzle and supplied with the developing liquid is suspended in the puddle of the cleaning liquid, and is not attached to the surface of the silicon wafer. Therefore, no developing failure occurs on a resist pattern of a photoresist on the surface of the silicon wafer, and the photoresist can well be developed to manufacture semiconductor integrated circuits with an increased yield.

According to another aspect of the present invention, there is also provided a method of developing an exposed photoresist coated on a surface of a silicon wafer with a developing liquid. In this method, before a developing liquid is supplied from developing liquid supply means to a surface of a silicon wafer held by wafer holding means, the silicon wafer is rotated by wafer rotating means, and a cleaning liquid is supplied from cleaning liquid supply means to the surface of the silicon wafer. Then, the developing liquid is supplied from the developing liquid supply means to the surface of the silicon wafer which is being supplied with the cleaning liquid while the silicon wafer is being rotated.

In the above method, the developing liquid is supplied to the surface of the silicon wafer which is being supplied with the cleaning liquid. An impurity contained in the developing liquid is suspended in the cleaning liquid that is being supplied, and is prevented from being attached to the surface of the silicon wafer.

According to still another aspect of the present invention, there is provided an apparatus for developing an exposed photoresist coated on a surface of a silicon wafer with a developing liquid, comprising wafer holding means, wafer rotating means, developing liquid supply means, cleaning liquid supply means, cleaning control means, and development control means. The wafer holding means holds the silicon wafer horizontally such that the surface coated with the photoresist faces upwardly. The wafer rotating means rotates the silicon wafer held by the wafer holding means in a horizontal plane. The developing liquid supply means supplies a developing liquid to the surface of the silicon wafer held by the wafer holding means. The cleaning liquid supply means supplies a cleaning liquid to the surface of the silicon wafer held by the wafer holding means. The cleaning control means and the development control means control the developing liquid supply means, the cleaning liquid supply means, and the wafer rotating means.

Specifically, the cleaning control means controls the cleaning liquid supply means to supply the cleaning liquid to form a puddle of the cleaning liquid on the surface of the silicon wafer before the developing liquid is supplied from the developing liquid supply means to the surface of the silicon wafer held by the wafer holding means. The development control means controls the wafer rotating means to start rotating the silicon wafer and controlling the developing liquid supply means to start supplying the developing liquid after the puddle of the cleaning liquid is formed on the surface of the silicon wafer by the cleaning control means. Therefore, the developing liquid is supplied to the surface of the silicon wafer with the puddle of the cleaning liquid formed thereon.

According to yet another aspect of the present invention, there is also provided an apparatus for developing an exposed photoresist coated on a surface of a silicon wafer with a developing liquid. In this apparatus, the cleaning control means and the development control means control the developing liquid supply means, the cleaning liquid supply means, and the wafer rotating means in a manner different from the pattern described above. Specifically, the cleaning control means controls the wafer rotating means to rotate the silicon wafer held by the wafer holding means and controlling the cleaning liquid supply means to supply the cleaning liquid to the surface of the silicon wafer before the developing liquid is supplied from the developing liquid supply means to the surface of the silicon wafer. The development control means controls the developing liquid supply means to supply the developing liquid to the surface of the silicon wafer which is being supplied with the cleaning liquid while the silicon wafer is being rotated by the cleaning control means. Therefore, the developing liquid is supplied to the surface of the silicon which is being supplied with the cleaning liquid.

In the above apparatus, the cleaning control means stops supplying the cleaning liquid after the developing liquid starts being supplied, and the development control means ends supplying the developing liquid after stopping supplying the cleaning liquid. Specifically, the surface of the silicon wafer is supplied with both the cleaning liquid and the developing liquid. Then, the supply of the cleaning liquid is stopped. Thereafter, the supply of the developing liquid is stopped. Consequently, the photoresist on the surface of the silicon wafer is well developed by the developing liquid that is eventually supplied solely.

The apparatus also has wafer cleaning means for controlling the cleaning liquid supply means to supply the cleaning liquid to the surface of the silicon wafer after the photoresist thereon is developed. The developing liquid on the surface of the silicon wafer after the photoresist thereon is developed is removed by the cleaning liquid supplied from the cleaning liquid supply means. Thus, means for supplying the cleaning liquid to the silicon wafer before the developing liquid is supplied is also used as means for supplying the cleaning liquid to remove the developing liquid. It is therefore possible to provide a developing apparatus which is simple in structure and capable of preventing exposure defects, without the need for adding dedicated hardware.

The apparatus further has developing liquid deaerating means for deaerating the developing liquid supplied to the surface of the silicon wafer. Since the developing liquid supplied to the surface of the silicon wafer is deaerated by the developing liquid deaerating means, a developing liquid containing air bubbles is not supplied to the surface of the silicon wafer.

A development control apparatus according to the present invention is provided in the above developing apparatus for controlling operation of the wafer holding means, the wafer rotating means, the cleaning liquid supply means, and the developing liquid supply means.

According to an aspect of the present invention, the development control apparatus has cleaning control means and development control means. The cleaning control means controls the cleaning liquid supply means to supply the cleaning liquid to form a puddle of the cleaning liquid on the surface of the silicon wafer before the developing liquid is supplied from the developing liquid supply means to the surface of the silicon wafer held by the wafer holding means. The development control means controls the wafer rotating means to start rotating the silicon wafer and controlling the developing liquid supply means to start supplying the developing liquid after the puddle of the cleaning liquid is formed on the surface of the silicon wafer by the cleaning control means.

According to another aspect of the present invention, the development control apparatus controls the developing liquid supply means, the cleaning liquid supply means, and the wafer rotating means in a manner different from the above pattern. Specifically, the cleaning control means controls the wafer rotating means to rotate the silicon wafer held by the wafer holding means and controlling the cleaning liquid supply means to supply the cleaning liquid to the surface of the silicon wafer before the developing liquid is supplied from the developing liquid supply means to the surface of the silicon wafer. The development control means controls the developing liquid supply means to supply the developing liquid to the surface of the silicon wafer which is being supplied with the cleaning liquid while the silicon wafer is being rotated by the cleaning control means.

The various means referred to in the present invention may be arranged to operate depending on their functions. These means may be implemented by dedicated hardware that operates depending on the functions, a computer that operates depending on the functions according to a program, a program for enabling a computer to operate depending on the functions, or a combination thereof.

An information storage medium according to the present invention stores a program for controlling operation of the wafer holding means, the wafer rotating means, the cleaning liquid supply means, and the developing liquid supply means in the above developing apparatus.

According to an aspect of the present invention, the information storage medium stores a program which enables a computer to perform a process including the steps of controlling the cleaning liquid supply means to supply the cleaning liquid to form a puddle of the cleaning liquid on the surface of the silicon wafer before the developing liquid is supplied from the developing liquid supply means to the surface of the silicon wafer held by the wafer holding means, and controlling the wafer rotating means to start rotating the silicon wafer and controlling the developing liquid supply means to start supplying the developing liquid after the puddle of the cleaning liquid is formed on the surface of the silicon wafer by the cleaning control means.

According to another aspect of the present invention, the information storage medium stores a program which enables a computer to perform a process including the steps of controlling the wafer rotating means to rotate the silicon wafer held by the wafer holding means and controlling the cleaning liquid supply means to supply the cleaning liquid to the surface of the silicon wafer before the developing liquid is supplied from the developing liquid supply means to the surface of the silicon wafer, and controlling the developing liquid supply means to supply the developing liquid to the surface of the silicon wafer which is being supplied with the cleaning liquid while the silicon wafer is being rotated by the cleaning control means.

The above and other objects, features, and advantages of the present invention will become apparent from the following description with reference to the accompanying drawings which illustrate examples of the present invention.

BRIEF DESCRIPTION OF THE DRAWINGS

FIGS. 8a and 8b are perspective views showing a central structure of the developing apparatus shown in FIG. 7a;

FIG. 9 is a block diagram of the developing apparatus shown in FIG. 7a;

FIG. 11 is a sequence chart showing the developing process carried out by the developing apparatus shown in FIG. 7a;

FIG. 12 is a flowchart of the developing process carried out by the developing apparatus shown in FIG. 7a;

DESCRIPTION OF THE PREFERRED EMBODIMENTS

Figure 1A:
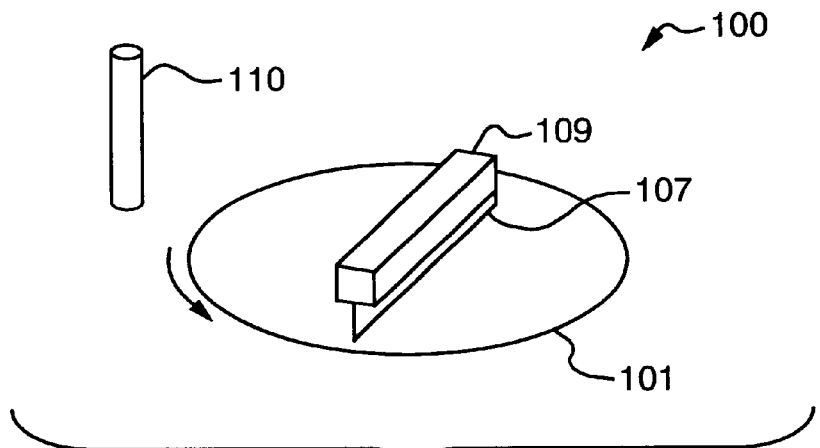
FIGS. 1a and 1b are perspective views showing a central structure of a first conventional developing apparatus.
Figure 1B:
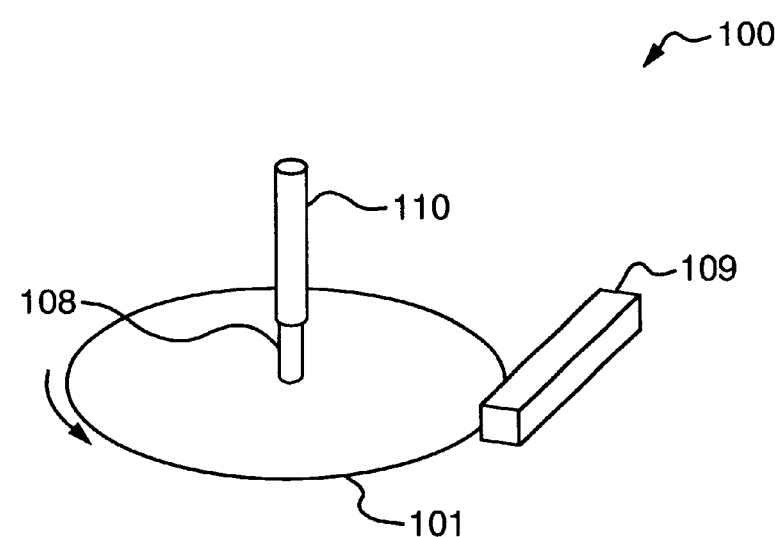
Figure 2A:
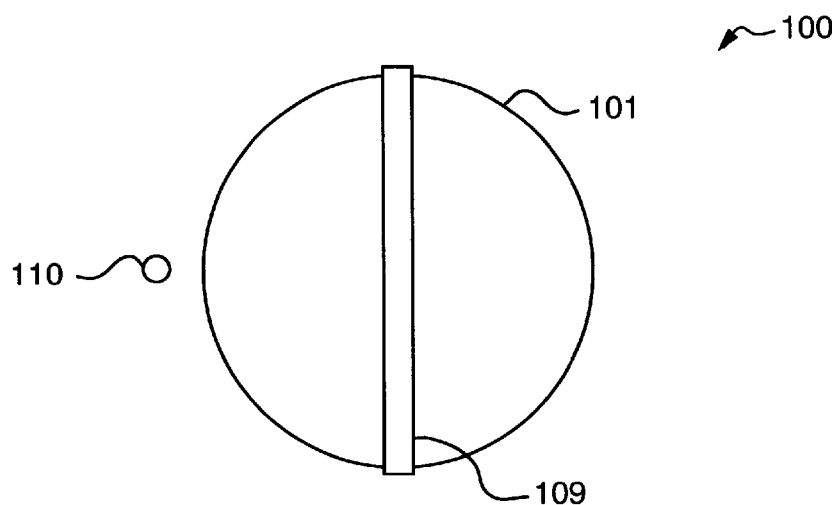
FIGS. 2a and 2b are plan views of the central structure of the first conventional developing apparatus shown in FIGS. 1a and 1b.
Figure 2B:
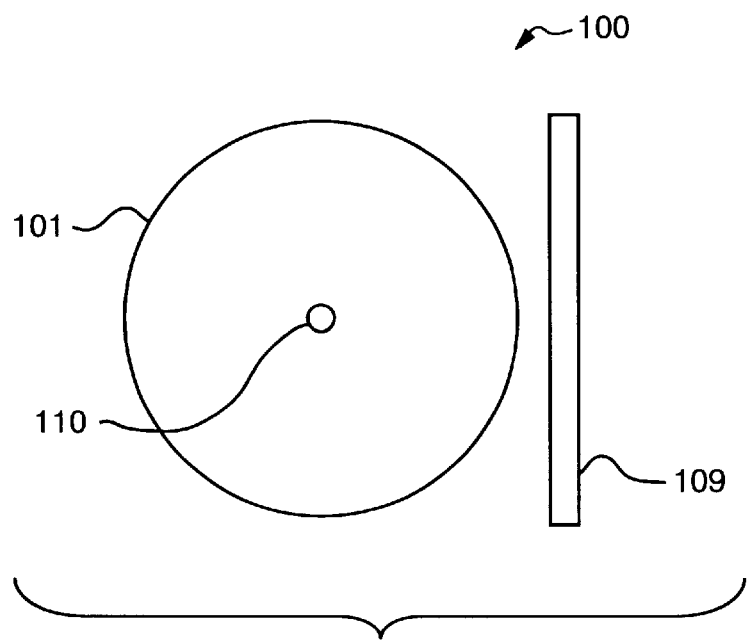
Figure 3:
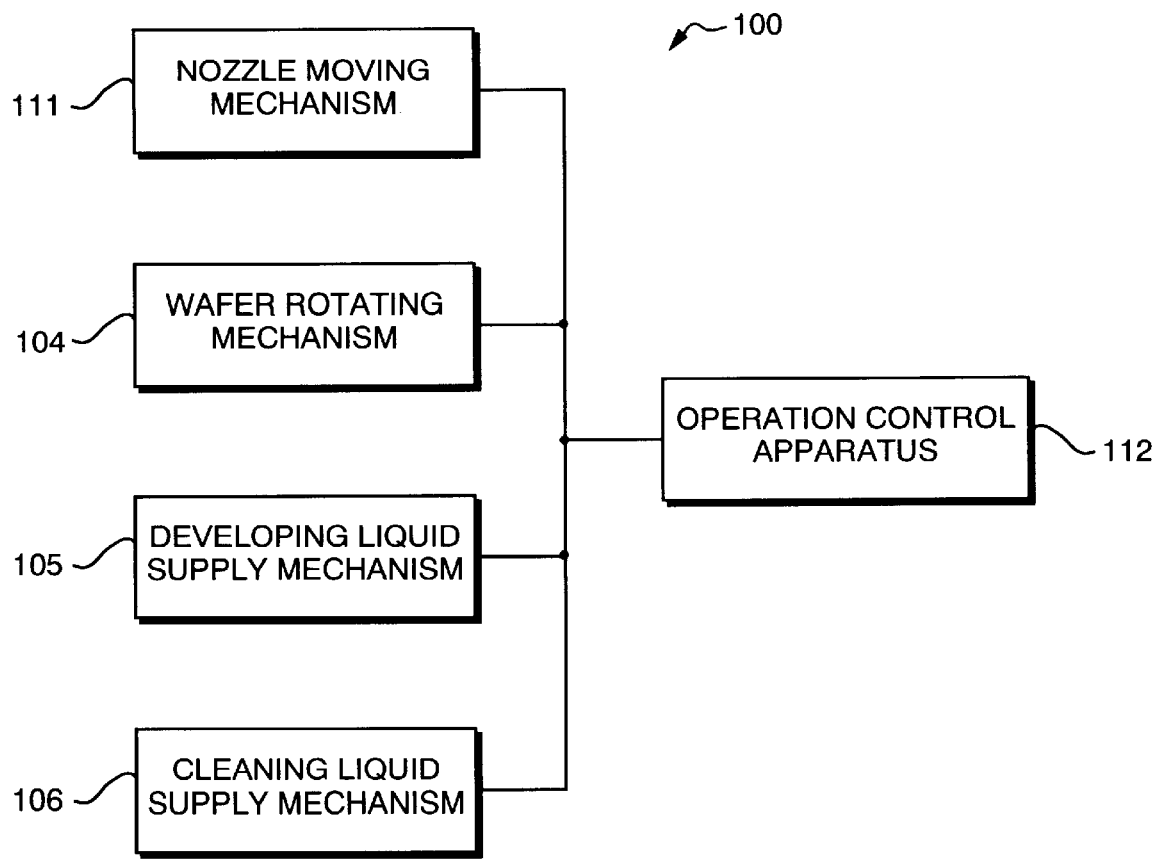
FIG. 3 is a block diagram of the first conventional developing apparatus shown in FIGS. 1a and 1b.
Figure 4A:
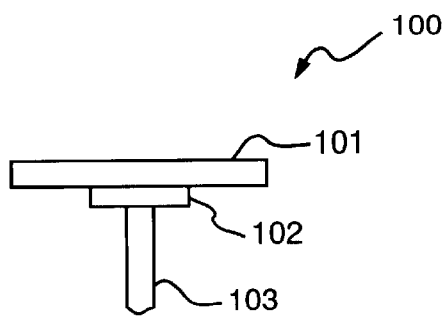
FIGS. 4a through 4e are views illustrative of a developing process carried out by the first conventional developing apparatus shown in FIGS. 1a and 1b.
Figure 4D:
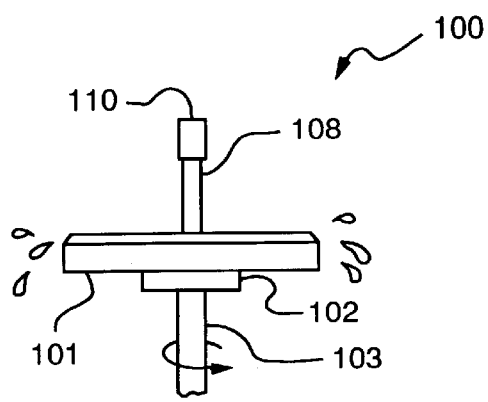
Figure 4B:
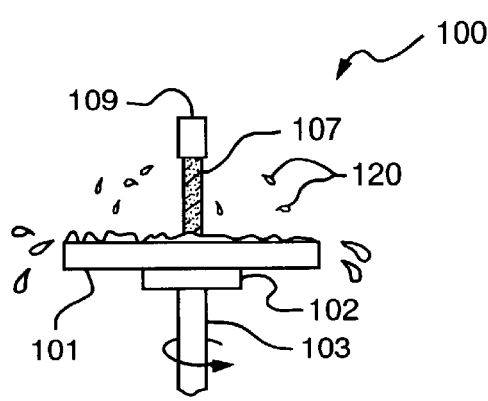
Figure 4E:
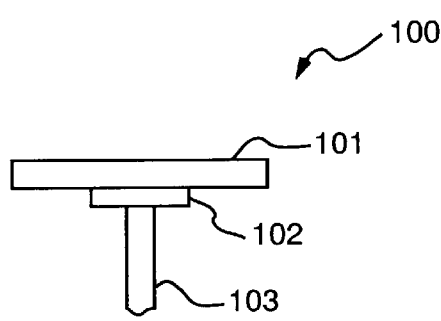
Figure 4C:
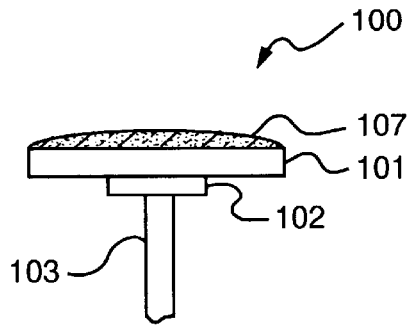
Figure 5:
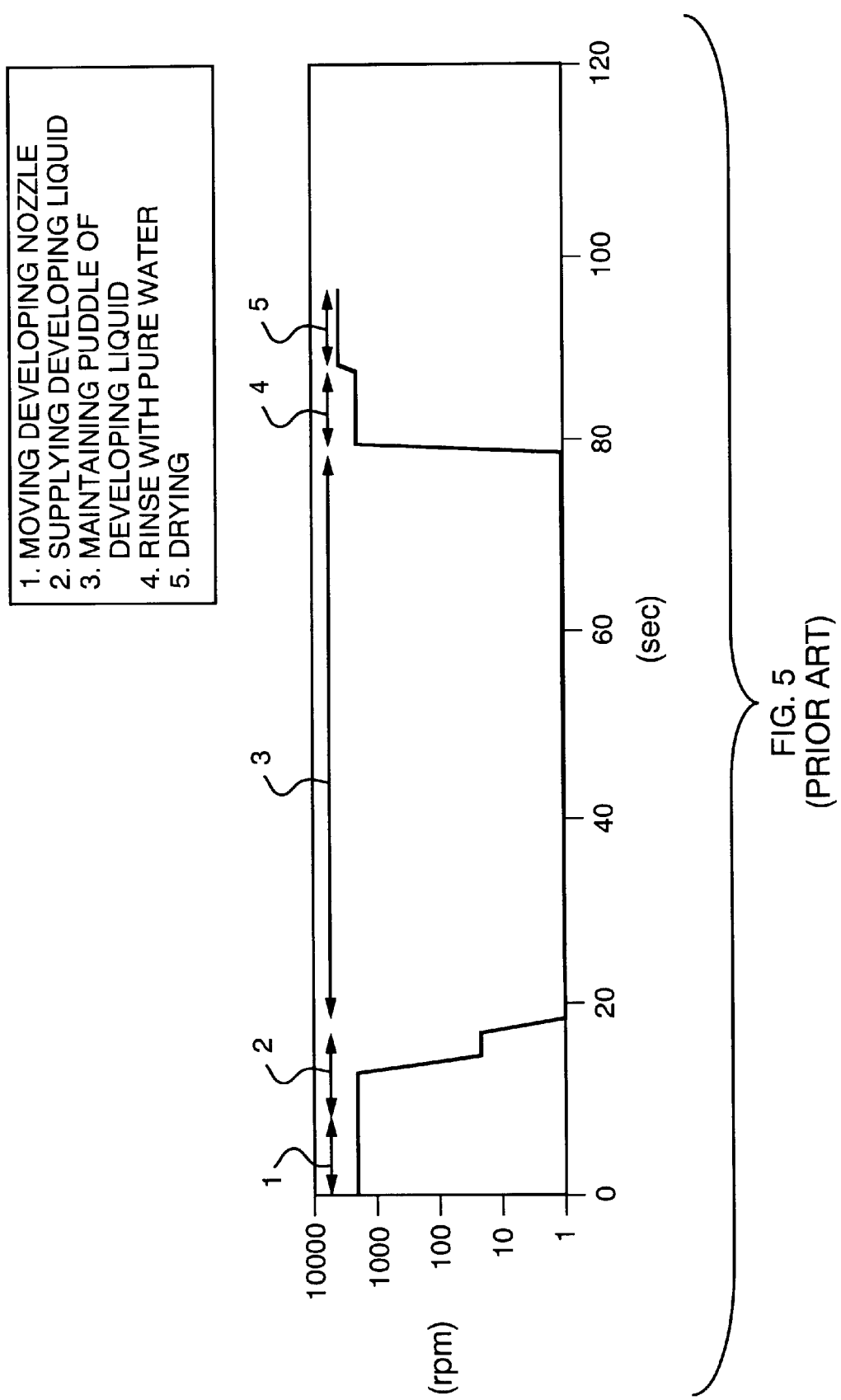
FIG. 5 is a sequence chart showing the developing process carried out by the first conventional developing apparatus shown in FIGS. 1a and 1b.
Figure 6A:
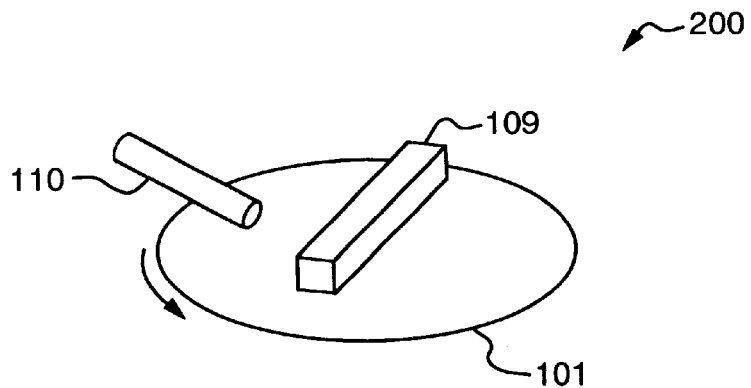
FIGS. 6a and 6b are perspective view and plane view showing a central structure of a second conventional developing apparatus, respectively.
Figure 6B:
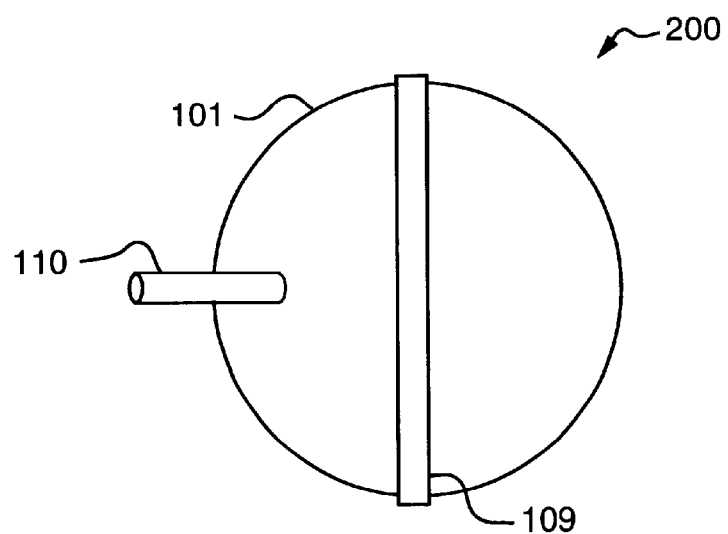

As shown in FIGS. 7a through 10, developing apparatus 300 according to the present invention has a hardware arrangement that is similar to the conventional developing apparatus 100. Specifically, developing apparatus 300 comprises wafer chuck mechanism 302 as a wafer holding means, wafer rotating mechanism 304 as a wafer rotating means, developing liquid supply mechanism 305 as a developing liquid supply means, cleaning liquid supply mechanism 306 as a cleaning liquid supply means, nozzle moving mechanism 311, and operation control circuit 312 as a development control apparatus. Operation control circuit 312 comprises computer 315 shown in FIG. 10 and a control program for enabling computer 315 to perform its operation. The program is stored in memory 316 that serves as an information storage medium in computer 315.

The control program installed in operation control circuit 312 is different from the control program installed in conventional developing apparatus 100. Therefore, details of a developing process carried out by mechanisms 304–306, 311 are different from those of the developing process carried out by conventional developing apparatus 100.

Specifically, operation control circuit 312 is operated according to the installed control program to function as a cleaning control means, a development control means, and a wafer cleaning means. Before the surface of silicon wafer 301 held by wafer chuck mechanism 302 is supplied with developing liquid 307 by developing liquid supply mechanism 305, operation control circuit 312 controls cleaning liquid supply mechanism 306 to supply pure water 308 to form a puddle on the surface of silicon wafer 301. A program for performing such an operation and computer 315 for outputting command signals to carry out the operation according to the program are combined into cleaning control circuit 313 as the cleaning control means.

After the puddle of cleaning liquid 308 is formed, operation control circuit 312 controls wafer rotating mechanism 304 to start rotating silicon wafer 301 and also controls developing liquid supply mechanism 305 to start supplying developing liquid 307. After the development of the photoresist with developing liquid 307 is completed, operation control circuit 312 controls cleaning liquid supply mechanism 306 to supply pure water 308 to the surface of silicone wafer 301 to remove developing liquid 307. A program for performing such an operation and computer 315 for outputting command signals to carry out the operation according to the program are combined into development control circuit 314 as the development control means.

In developing apparatus 300, a developing liquid deaerating means comprising a vacuum pump or the like is connected to developing liquid supply mechanism 305. The developing liquid deaerating means deaerates developing liquid 307 that is supplied from developing liquid supply mechanism 305 to the surface of silicone wafer 301.

Figure 7A:
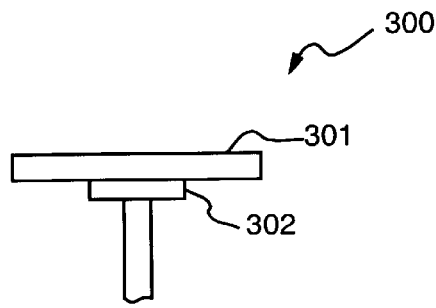
FIGS. 7a through 7g are views illustrative of a developing process carried out by a developing apparatus according to the present invention.

A process of developing an exposed photoresist with developing apparatus 300 according to the present invention will be described below. As shown in FIG. 7a, silicon wafer 301 whose surface is coated with a photoresist is horizontally held by wafer chuck mechanism 302. Then, as shown in FIG. 11, silicon wafer 301 held by wafer chuck mechanism 302 is rotated at a high speed by wafer rotating mechanism 304.

Figure 7E:
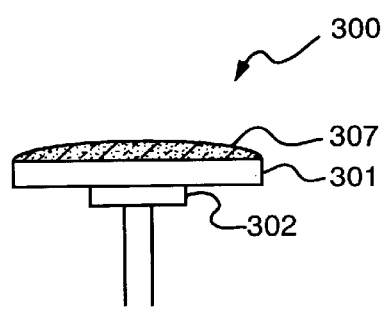
Figure 7B:
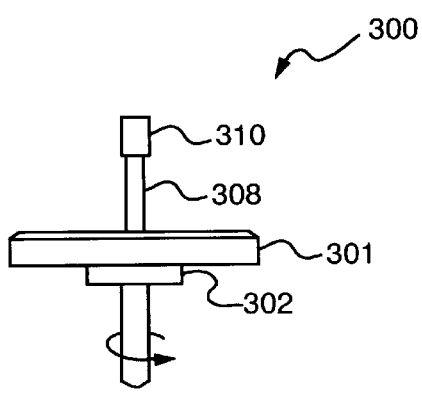
Figure 7F:
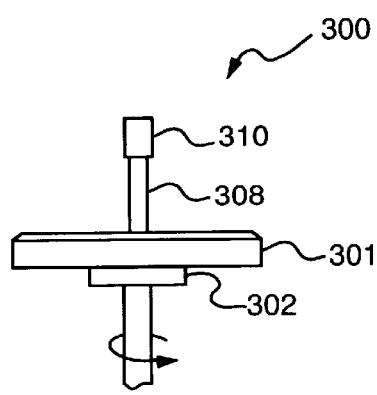
Figure 11:
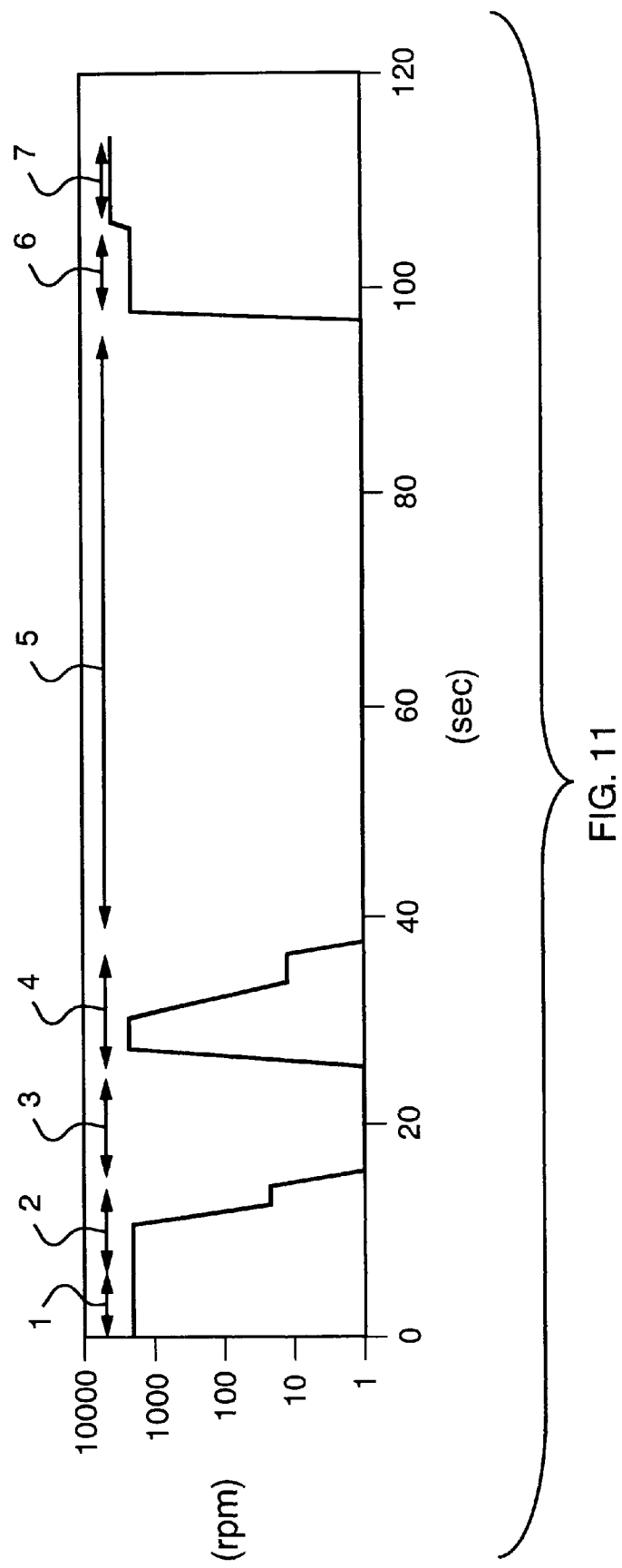
Figure 12:
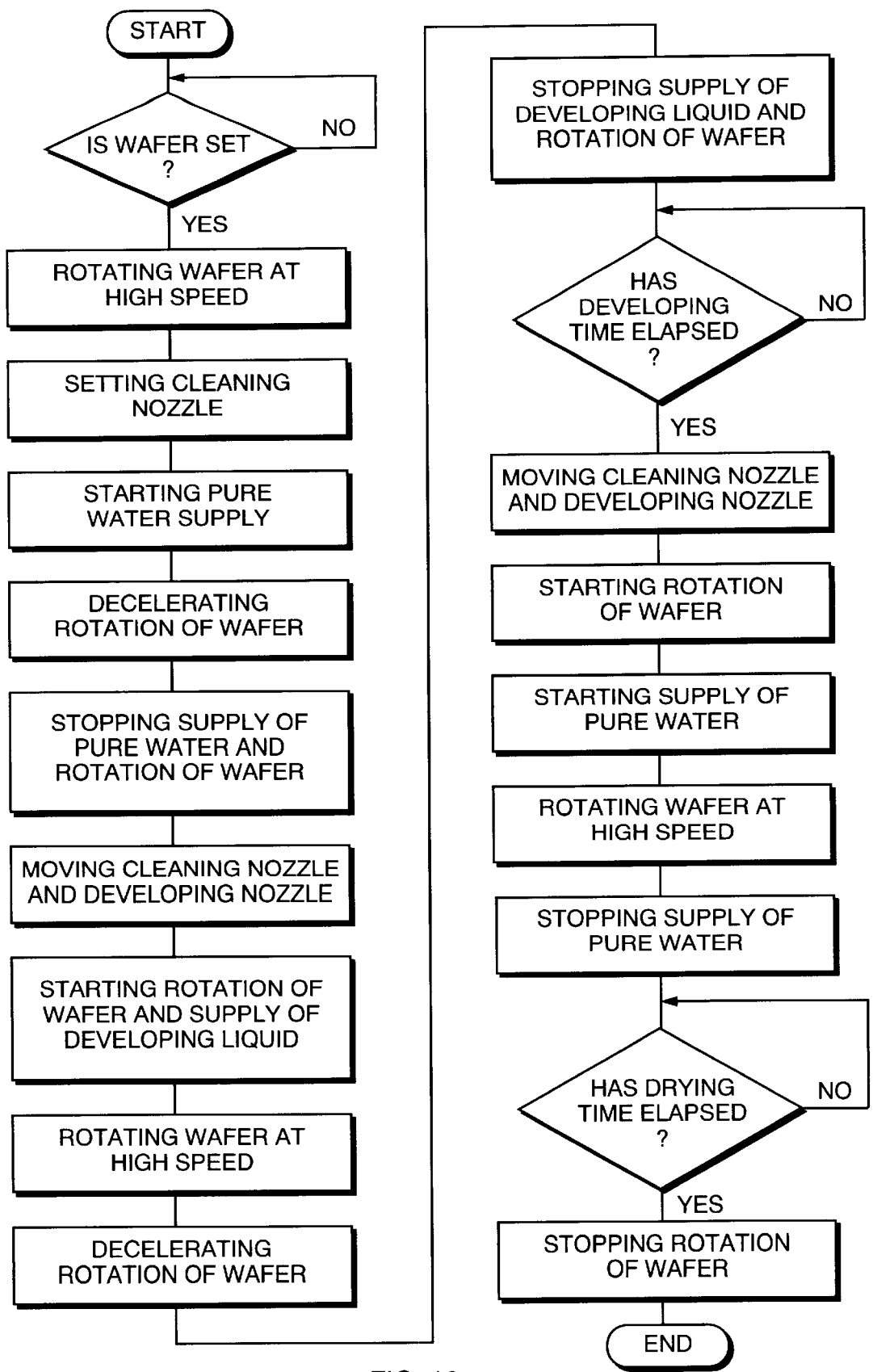

In a period ① shown in FIG. 11, cleaning nozzle 310 of cleaning liquid supply mechanism 306 is moved to a position facing the surface of silicon wafer 301 by nozzle moving mechanism 311. Thereafter, as shown in FIG. 7b, in a period ② shown in FIG. 11, pure water 308 is supplied to the surface of silicon wafer 301 which is being rotated at a high speed.

Figure 7C:
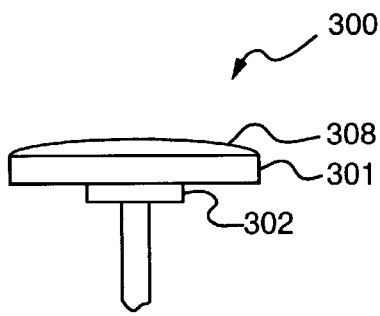
Figure 7G:
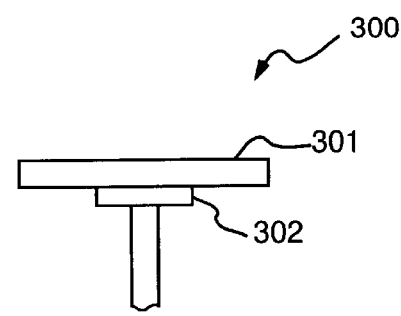

While pure water 308 is being supplied to the surface of silicon wafer 301, the rotation of silicon wafer 301 is gradually decelerated to a predetermined speed, after which the supply of pure water 308 is stopped. As shown in FIG. 7c, a puddle of pure water 308 is now formed on the surface of silicon wafer 101.

Figure 7D:
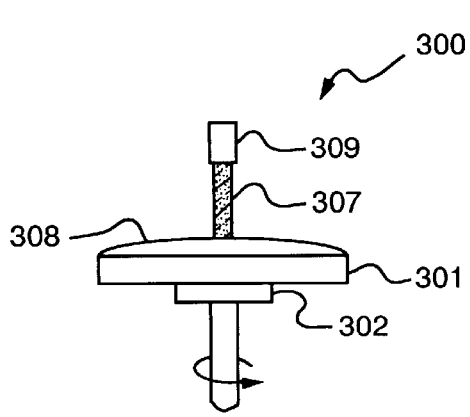
Figure 8A:
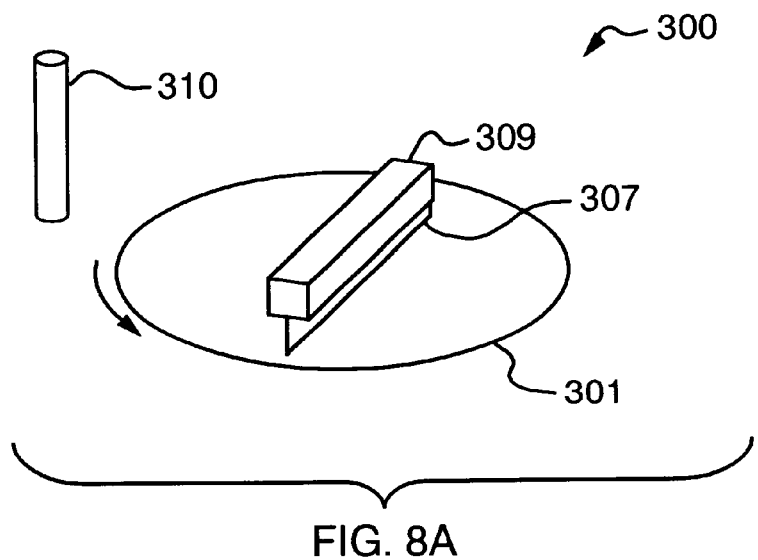
Figure 8B:
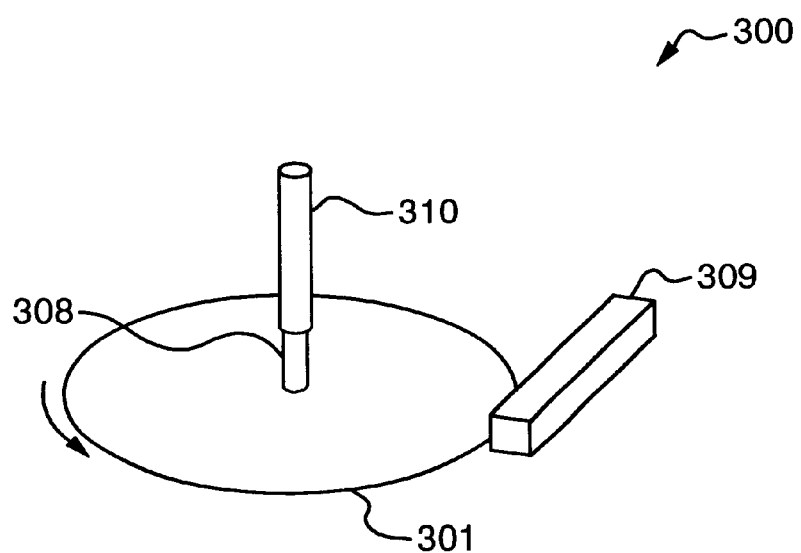
Figure 9:
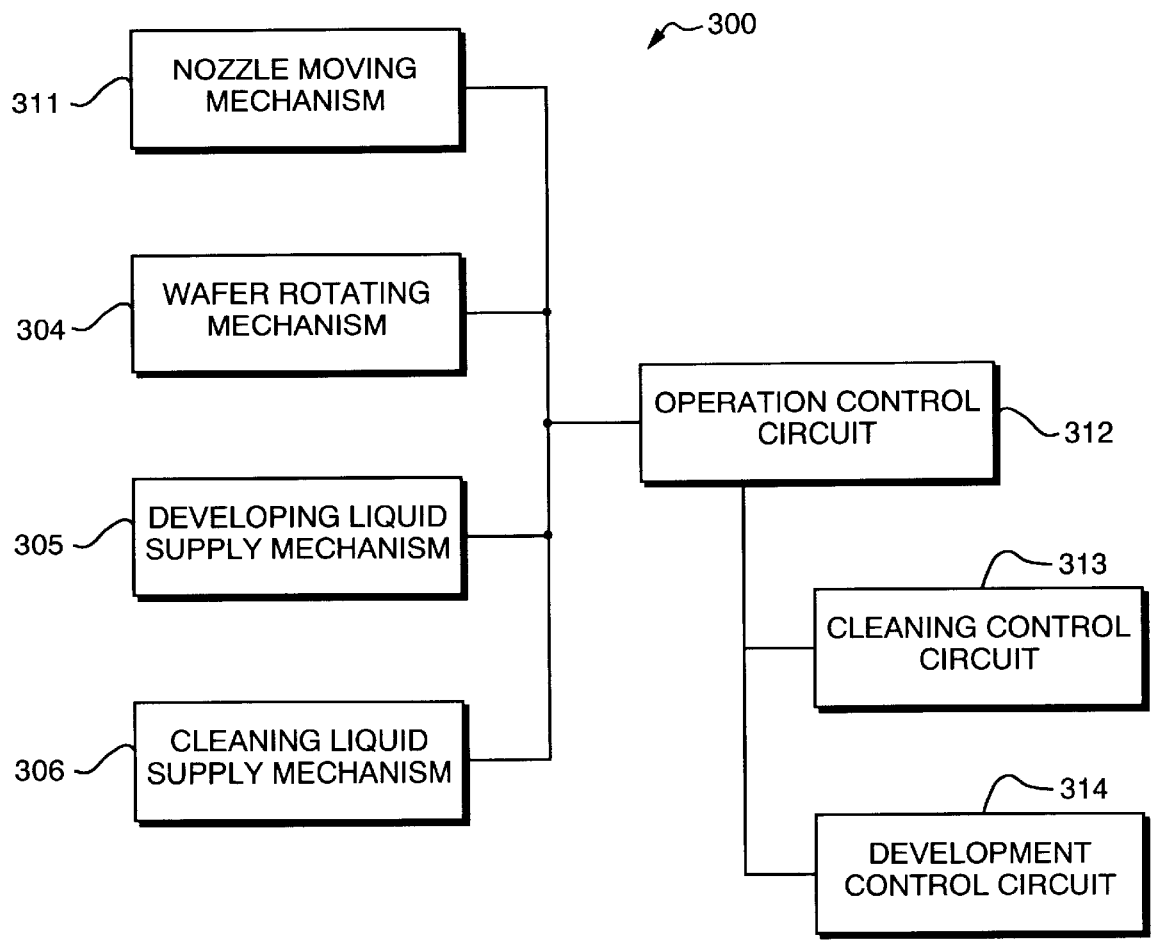
Figure 10:
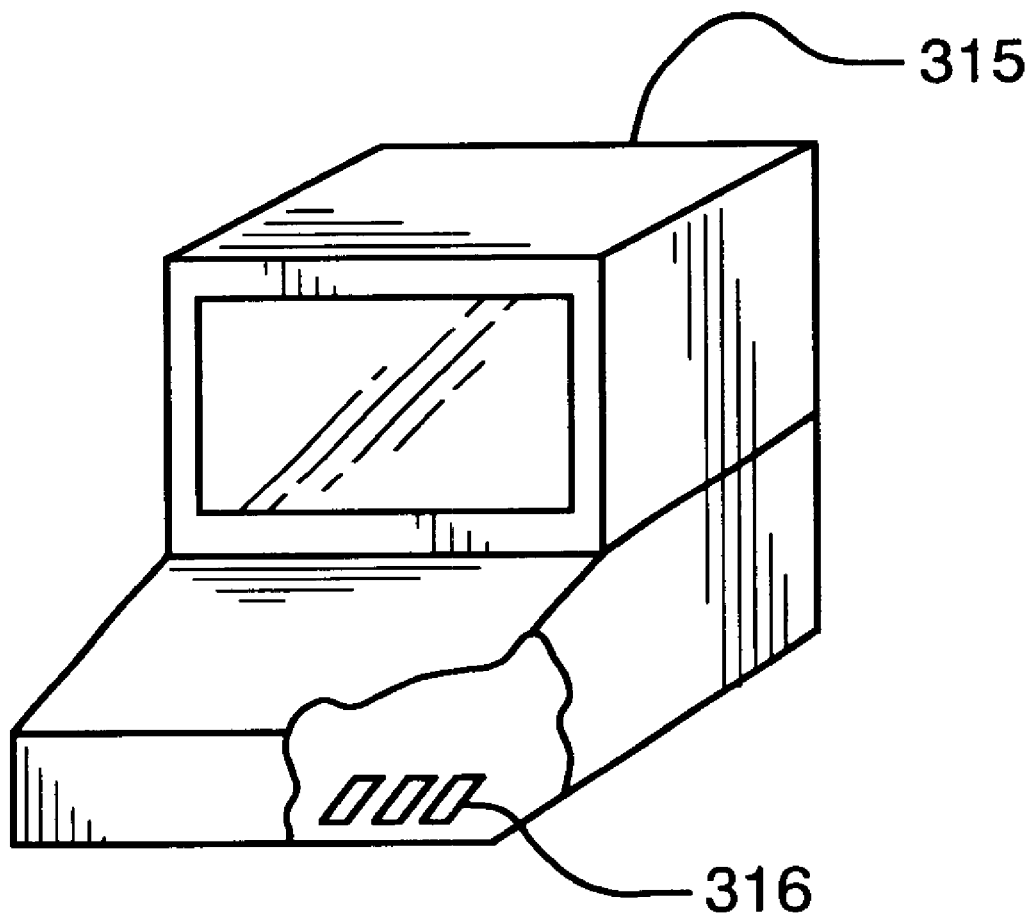
FIG. 10 is a perspective view of a computer for serving as an operation control circuit shown in FIG. 9.

In a period ③ shown in FIG. 11, developing nozzle 309 of developing liquid supply mechanism 305 is moved to a position facing the surface of silicon wafer 301 by nozzle moving mechanism 311. Thereafter, as shown in FIG. 7d, in a ④ period shown in FIG. 11, wafer rotating mechanism 304 rotates silicon wafer 301 and developing liquid supply mechanism 305 supplies developing liquid 307 to the surface of silicon wafer 301. Therefore, developing liquid 307 is supplied to the surface of silicon wafer 301 on which the puddle of pure water 308 has been formed.

While developing liquid 307 is being supplied to the surface of silicon wafer 301, the rotation of silicon wafer 301 is gradually accelerated and then gradually decelerated to a predetermined speed, after which the supply of developing liquid 307 is stopped. The pure water 308 is progressively removed from the surface of silicon wafer 301, and a puddle of developing liquid 307 is now formed on the surface of silicon wafer 301. As shown in FIG. 7e, in a period ⑤ shown in FIG. 11, the puddle of developing liquid 307 is maintained on the surface of silicon wafer 301 for a predetermined time to develop the exposed photoresist.

Thereafter, silicon wafer 301 is processed in the same manner as with the developing process carried out by conventional developing apparatus 100. After elapse of a certain time, silicone wafer 301 is rotated at a high speed, developing liquid 307 is removed by pure water 308, thereafter the supply of pure water 308 is stopped, and the surface of silicon wafer 301 is dried by air.

With developing apparatus 300 according to the present embodiment, as described above, before developing liquid 307 is supplied from developing liquid supply mechanism 305 to the surface of silicon wafer 301, pure water 308 is supplied from cleaning liquid supply mechanism 306 to form a puddle of pure water 308 on the surface of silicon wafer 301. After the puddle of pure water 308 is on the surface of silicon wafer 301, silicon wafer 301 is rotated by wafer rotating mechanism 304 and the surface of silicon wafer 301 is supplied with developing liquid 307 from developing liquid supply mechanism 305.

Therefore, even if a mist is produced from developing liquid 307 supplied to the surface of silicon wafer 301 and deposited on developing nozzle 309, and even if an impurity contained in the mist is supplied together with developing liquid 307 to silicon wafer 301, the impurity contained in supplied developing liquid 307 is suspended in the puddle of pure water 308 and is not attached to the surface of silicon wafer 301.

According to the developing process carried out by developing apparatus 300, therefore, no developing failure occurs on the resist pattern of the photoresist on the surface of silicon wafer 301, and the photoresist can well be developed to manufacture semiconductor integrated circuits with an increased yield.

Cleaning liquid supply mechanism 306 that supplies pure water 308 to remove developing liquid 307 from the surface of silicon wafer 301 whose photoresist has been developed is also used to supply pure water 308 to the surface of silicon wafer 301 to prevent a developing failure from occurring on the resist pattern. Therefore, no additional dedicated equipment is required, and developing apparatus 300 is relatively simple in structure.

With developing apparatus 300, furthermore, developing liquid 307 supplied from developing liquid supply mechanism 305 to the surface of silicon wafer 301 is deaerated by the developing liquid deaerating means. Therefore, the surface of the photoresist is not supplied with developing liquid 307 which contains air bubbles.

Consequently, the resist pattern of the photoresist on the surface of silicon wafer 301 does not suffer a developing failure due to air bubbles which would otherwise be contained in developing liquid 307. It is not necessary to form a puddle of pure water 308 on the surface of silicon wafer 301 in order to prevent a developing failure on the resist pattern due to air bubbles which would otherwise be contained in developing liquid 307.

Figure 13A:
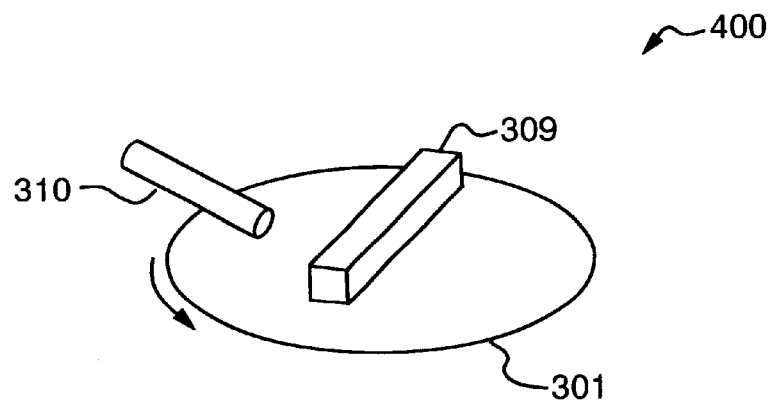
FIGS. 13a and 13b are perspective view and plane view showing a central structure of a modified developing apparatus according to the present invention, respectively.
Figure 13B:
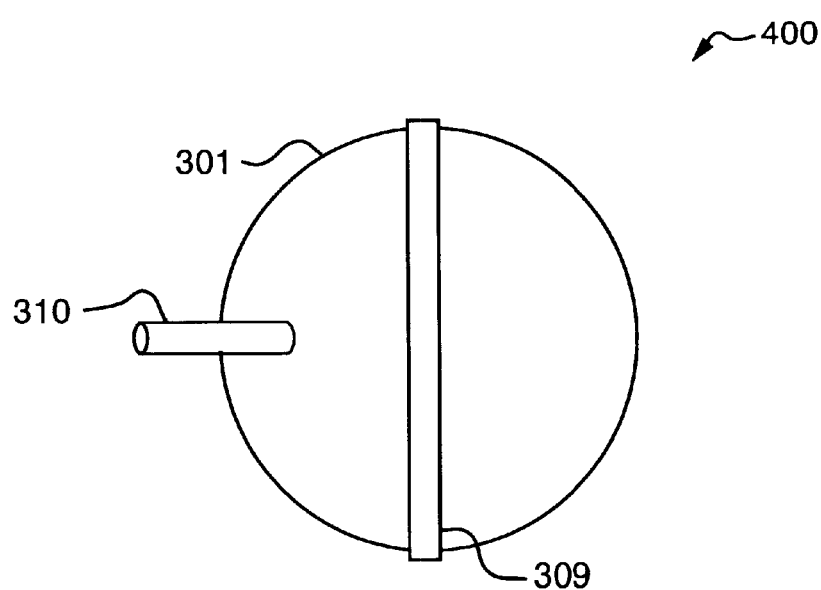

The present invention is not limited to details shown in the above embodiment, but various modifications may be made therein without departing from the scope thereof. For example, while in the above embodiment developing nozzle 309 and cleaning nozzle 310 are supported by nozzle moving mechanism 311 for movement between the position which faces the surface of silicon wafer 301 and the position retracted away from the surface of silicon wafer 301. However, as shown in FIGS. 13a and 13b, the principles of the present invention are also applicable to a developing apparatus 400 which has developing nozzle 309 and cleaning nozzle 310 which are oriented toward the center of silicon wafer 301.

In such a modification, after a puddle of pure water 308 is formed, developing liquid 307 may start to be supplied and silicon wafer 301 may start to be rotated. However, the following processing operation may be performed. As shown in FIG. 15, in a period ① shown in FIG. 14, wafer rotating mechanism 304 rotates silicon wafer 301, and developing nozzle 309 and cleaning nozzle 310 are set in a position facing the surface of silicon wafer 301.

Figure 14:
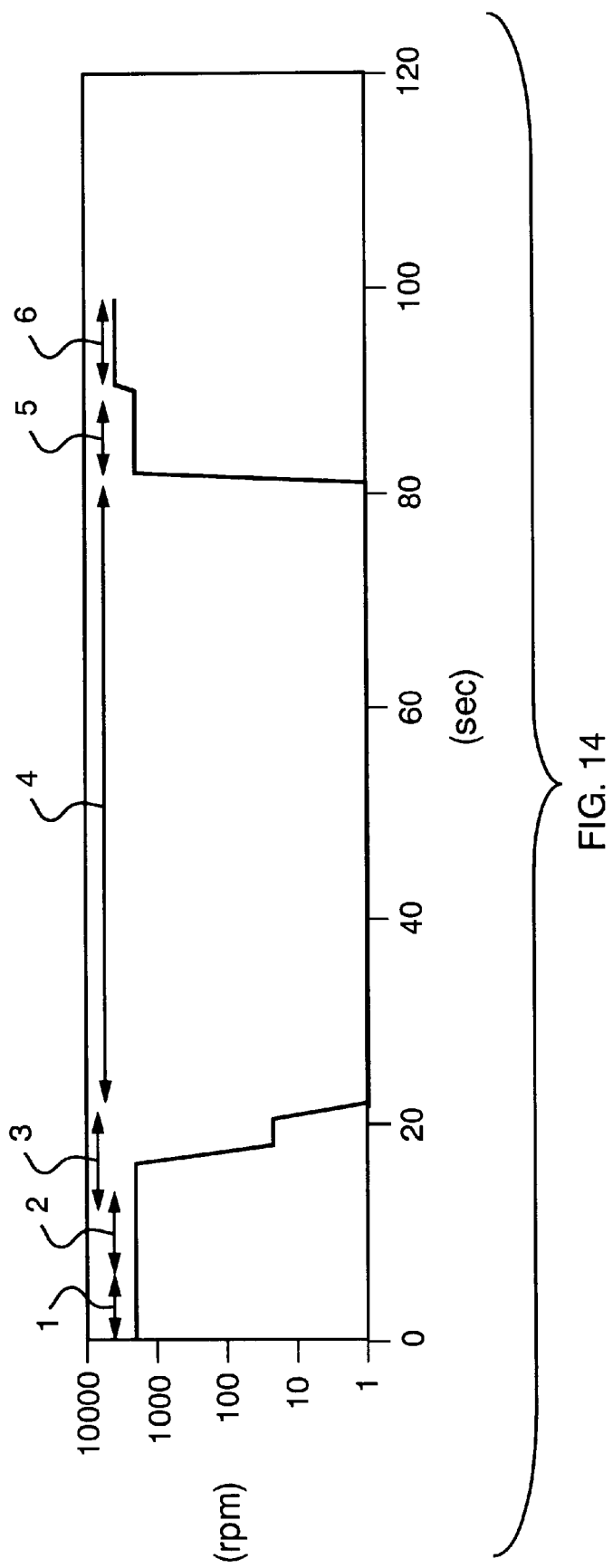
FIG. 14 is a sequence chart showing a developing process carried out by the developing apparatus shown in FIGS. 13a and 13b.
Figure 15:
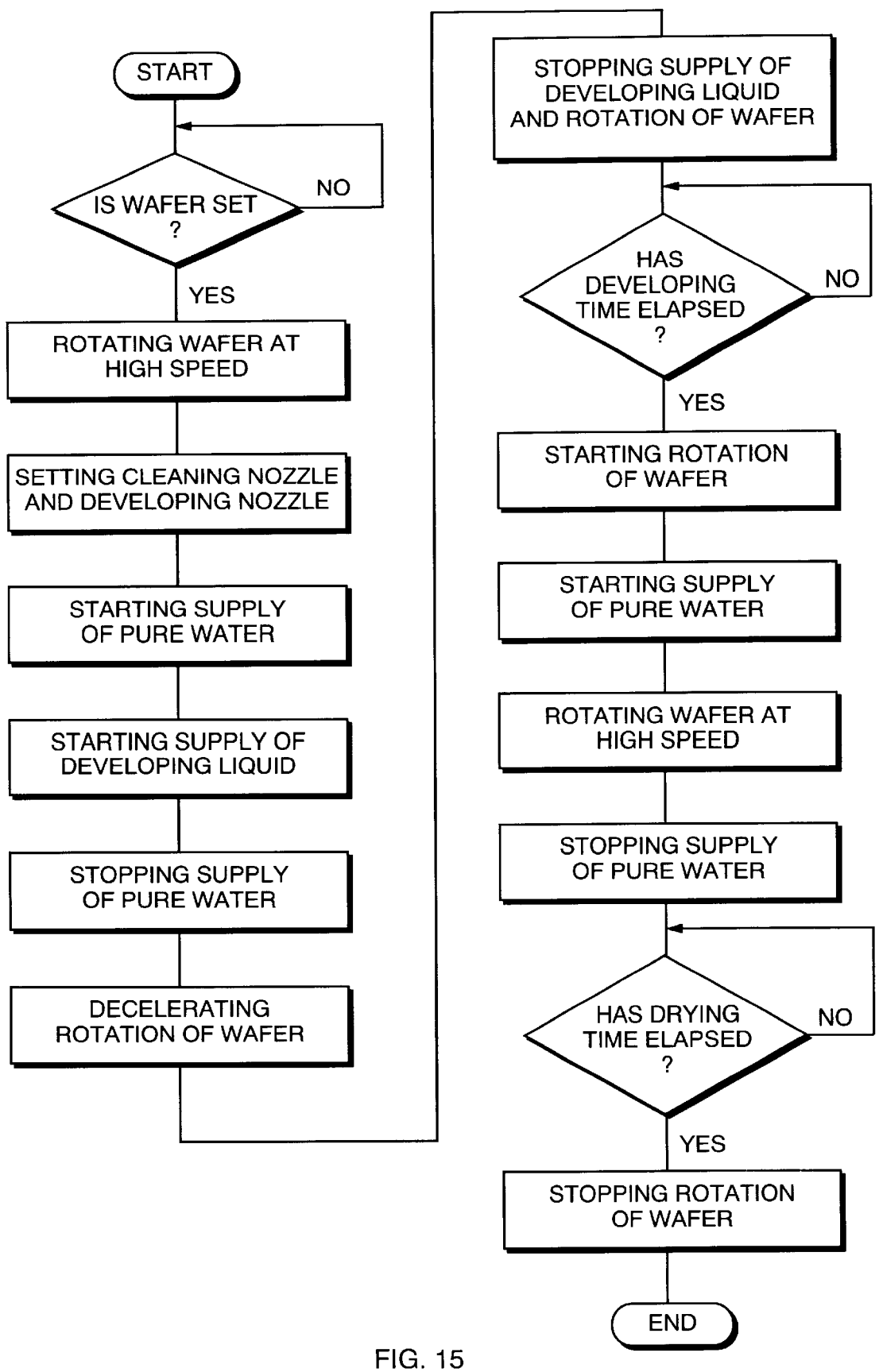
FIG. 15 is a flowchart of the developing process carried out by the developing apparatus shown in FIGS. 13a and 13b.

Then, in a period ② shown in FIG. 14, before developing liquid 307 is supplied from developing liquid supply mechanism 305, pure water 308 is supplied from cleaning liquid supply mechanism 306 to the surface of silicon wafer 301, and thereafter, in a period ③ shown in FIG. 14, developing liquid 307 is supplied from developing liquid supply mechanism 305 to the surface of silicon wafer 301 which is being supplied with pure water 308 while in rotation. After developing liquid 307 starts to be supplied, the supply of pure water 308 is stopped. After the supply of pure water 308 is stopped, the supply of developing liquid 307 is stopped. Thereafter, silicon wafer 301 is processed in the same manner as with the developing process carried out by conventional developing apparatus 100.

As described above, only pure water 308 is supplied at first, then both pure water 308 and developing liquid 307 are supplied, and finally only developing liquid 307 is supplied. Accordingly, a contaminant from developing nozzle 309 is also prevented from being attached to the surface of silicon wafer 301, so that the resist pattern is prevented from suffering a developing failure and the photoresist can well be developed.

According to the developing process carried out by the developing apparatus 400 which has both developing nozzle 309 and cleaning nozzle 310 oriented toward the center of silicon wafer 301, since developing nozzle 309 and cleaning nozzle 310 do not need to be moved during the developing process, silicon wafer 301 can be processed more quickly than according to the developing process carried out by the developing apparatus 300.

In the above embodiments, pure water 308 is used as the cleaning liquid. However, the cleaning liquid may comprise a liquid which does not produce any residues when dried with air and which is capable of cleaning developing liquid 307 without affecting the photoresist, such as a solution of alcohol or pure water mixed with a surface active agent.

In the above embodiments, suitable software is installed in operation control circuit 312, which comprises a computer, to provide various means including the cleaning control means and the development control means. However, these various means may be implemented by respective dedicated pieces of hardware, or may be partly implemented by software and partly implemented by hardware.

While preferred embodiments of the present invention have been described using specific terms, such description is for illustrative purposes only, and it is to be understood that changes and variations may be made without departing from the spirit or scope of the following claims.

What is claimed is:

1. A method of developing an exposed photoresist coated on a surface of a silicon wafer with a developing liquid, comprising the steps of:

holding the silicon wafer horizontally such that the surface coated with the photoresist faces upwardly;

rotating the silicon wafer, and supplying a cleaning liquid to the surface of the silicon wafer thus held while decelerating the rotation of the silicon wafer, and thereafter, stopping the supply of the cleaning liquid when the rotation of the silicon wafer reaches a predetermined speed, to form a puddle of said cleaning liquid before the developing liquid is supplied to the surface of the silicon wafer; and rotating the silicon wafer while maintaining said puddle of the cleaning liquid formed thereon in a horizontal plane, and supplying said developing liquid to the surface of the silicon wafer containing said cleaning liquid.

2. A method of developing an exposed photoresist coated on a surface of a silicon wafer with a developing liquid, comprising the steps of:

holding the silicon wafer horizontally such that the surface coated with the photoresist faces upwardly;

rotating the silicon wafer thus held before the developing liquid is supplied to the surface of the silicon wafer, and supplying a cleaning liquid to the surface of the silicon wafer; and supplying said developing liquid to the surface of the silicon wafer which is being supplied with said cleaning liquid while the silicon wafer is being rotated.

3. A method, according to claim 1, further comprising:

prior to supplying a cleaning liquid, rotating the silicon wafer.

4. A method, according to claim 1, wherein supplying a cleaning liquid uses a liquid supplying nozzle.

5. A method, according to claim 1, wherein supplying said developing liquid uses a liquid supplying nozzle.

6. A method, according to claim 1, further comprising:

after supplying said developing liquid, supplying pure water to the silicon wafer.

7. A method, according to claim 2, wherein supplying a cleaning liquid uses a liquid supplying nozzle.

8. A method, according to claim 2, wherein supplying said developing liquid uses a liquid supplying nozzle.

9. A method, according to claim 2, further comprising:

while supplying said developing liquid, gradually accelerating rotation of the silicon wafer and then gradually decelerating rotation of the silicon wafer.

10. A method, according to claim 2, further comprising:

after supplying said developing liquid, supplying pure water to the silicon wafer.

11. A method of developing an exposed photoresist coated on a surface of a silicon wafer with a developing liquid, the method comprising:

holding the silicon wafer horizontally such that the surface coated with the photoresist faces upwardly;

supplying a cleaning liquid to the surface of the silicon wafer thus held to form a puddle of said cleaning liquid before the developing liquid is supplied to the surface of the silicon wafer;

prior to supplying a cleaning liquid, rotating the silicon wafer;

decelerating rotation of the silicon wafer while applying the cleaning liquid; and rotating the silicon wafer while maintaining said puddle of the cleaning liquid formed thereon in a horizontal plane, and supplying said developing liquid to the surface of the silicon wafer containing said cleaning liquid.

12. A method of developing an exposed photoresist coated on a surface of a silicon wafer with a developing liquid comprising:

holding the silicon wafer horizontally such that the surface coated with the photoresist faces upwardly;

supplying a cleaning liquid to the surface of the silicon wafer thus held to form a puddle of said cleaning liquid before the developing liquid is supplied to the surface of the silicon wafer;

rotating the silicon wafer while maintaining said puddle of the cleaning liquid formed thereon in a horizontal plane, and supplying said developing liquid to the surface of the silicon wafer containing said cleaning liquid; and while supplying said developing liquid, gradually accelerating rotation of the silicon wafer and then gradually decelerating rotation of the silicon wafer.

* * * * *